United States Patent
Hopper et al.

[11] Patent Number: 6,030,901
[45] Date of Patent: Feb. 29, 2000

[54] PHOTORESIST STRIPPING WITHOUT DEGRADING LOW DIELECTRIC CONSTANT MATERIALS

[75] Inventors: Dawn Hopper, San Jose; Richard J. Huang, Cupertino; Jacques Bertrand, Capitola; Lu You, Santa Clara, all of Calif.

[73] Assignee: Advanced Micro Devices, Inc., Sunnyvale, Calif.

[21] Appl. No.: 09/339,381

[22] Filed: Jun. 24, 1999

[51] Int. Cl.[7] .................. H01L 21/312; H01L 21/3065
[52] U.S. Cl. .................. 438/711; 438/725; 438/623; 204/192.36
[58] Field of Search .................. 438/623, 710, 438/711, 725; 204/192.32, 192.35, 192.36

[56] References Cited

U.S. PATENT DOCUMENTS

| | | | |
|---|---|---|---|
| 3,930,913 | 1/1976 | Jacob | 156/8 |
| 4,357,203 | 11/1982 | Zelez | 156/643 |
| 5,413,963 | 5/1995 | Yen et al. | 437/195 |
| 5,882,489 | 3/1999 | Bersin et al. | 204/192.35 |
| 5,958,798 | 9/1999 | Shields | 438/710 |

*Primary Examiner*—Mark Kopec

[57] ABSTRACT

Photoresist masks are stripped using a $H_2$-$N_2$ plasma to prevent increasing the dielectric constant of an exposed carbon-containing dielectric material. Embodiments of the present invention include forming a low dielectric constant, carbon-containing layer, e.g., a polymeric layer, on an exposed metal feature overlying a wafer, forming a photoresist mask on the dielectric layer, forming an opening in the dielectric layer exposing the metal feature and a portion of the dielectric layer, preheating the wafer and stripping the photoresist mask using the $H_2$-$N_2$ plasma.

18 Claims, 1 Drawing Sheet

PHOTORESIST STRIPPING WITHOUT DEGRADING LOW DIELECTRIC CONSTANT MATERIALS

TECHNICAL FIELD

The present invention relates to a semiconductor device with reduced capacitance loading, and to a method of manufacturing the semiconductor device. The present invention has particular applicability in manufacturing high density, multi-level semiconductor devices comprising submicron dimensions and exhibiting high circuit speed.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect ratios due to miniaturization.

Conventional semiconductor devices typically comprise a semiconductor substrate, such as undoped monocrystalline silicon, and a plurality of sequentially formed inter-layer dielectrics and patterned metal layers. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink into the deep submicron range.

A conductive plug filling a via opening is typically formed by depositing an inter-layer dielectric on a patterned conductive (metal) layer comprising at least one metal feature, forming an opening in the inter-layer dielectric by conventional photolithographic and etching techniques, and filling the opening with a conductive material, such as tungsten (W). Excess conductive material on the surface of the inter-layer dielectric is removed, as by chemical-mechanical polishing (CMP). One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line.

High performance microprocessor applications require rapid speed of semiconductor circuitry. The speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RC delay caused by the interconnect wiring increases. If the interconnection node is routed over a considerable distance, e.g., hundreds of microns or more, as in submicron technologies, the interconnection capacitance limits the circuit node capacitance loading and, hence, the circuit speed. As design rules are reduced to about 0.18 micron and below, e.g., about 0.15 micron and below, the rejection rate due to integrated circuit speed delays severely limits production throughput and significantly increases manufacturing costs. Moreover, as line widths decrease, electrical conductivity and electromigration resistance become increasingly important.

As device geometries shrink and functional density increases, it becomes increasingly imperative to reduce the capacitance between metal lines. Line -to- line capacitance can build up to a point where delay time and cross talk may hinder device performance. Reducing the capacitance within multi-level metallization systems will reduce the RC constant, cross talk voltage, and power dissipation between the lines.

One way to increase the speed of semiconductor circuitry is to reduce the resistance of a conductive pattern. Conventional metallization patterns are typically formed by depositing a layer of conductive material, notable aluminum or an alloy thereof, and etching, or by damascene techniques wherein trenches are formed in dielectric layers and filled with conductive material. The use of metals having a lower resistivity than aluminum, such as copper, engenders various problems which limit their utility. For example, copper readily diffuses through silicon dioxide, the typical dielectric material employed in the manufacture of semiconductor devices, and adversely affects the devices. In addition, copper does not form a passivation film, as does aluminum. Hence, a separate passivation layer is required to protect copper from corrosion.

The dielectric constant of materials currently employed in the manufacture of semiconductor devices for an inter-layer dielectric (ILD) spans from about 3.9 for dense silicon dioxide to over 8 for deposited silicon nitride. The value of the dielectric constants expressed herein is based upon a value of 1 for a vacuum. Prior attempts have been made to reduce the interconnect capacitance and, hence, increase the integrated circuit speed, by developing dielectric materials having a lower dielectric constant than that of silicon dioxide. Materials which may offer promise for use as ILDs include various carbon-containing low dielectric constant materials, typically having a dielectric constant of about 2.0 to about 3.8. Such carbon-containing dielectric materials include various polymers with carbon occupying a position in the backbone in an amount of about 0.5 to about 8 mol %, e.g., about 4 to about 8 mol %. Typical of such carbon-containing polymers are benzocyclobutene (BZB), methyl silsesquioxane (MSQ), FLARE®R, Silk®, JSR and Black Diamond®.

However, in attempting to employ such carbon-containing dielectric materials in interconnect technology, as for gap filling or as an ILD, it was found that their dielectric constant became undesirably elevated as a result of subsequent processing. For example, with BCB, the dielectric constant was found to increase from about 2.6 to greater than about 4. It is believed that such an increase occurs as a result of exposure to an oxide photoresist stripping technique used to remove photoresist material after formation of an opening in a dielectric layer, as, for example, a plug or dual damascene opening for interconnection of metal features on different metal levels.

The dry process of removing photoresist typically uses oxygen to strip organic resists. Plasma excitation results in atomic oxygen, which oxidizes photoresist into gases such as CO, $CO_2$, and $H_2O$ that are then removed from the chamber by a pump. A plasma chemistry weaker than $O_2$ is desired for stripping resist on sensitive films. Organic lo-k dielectrics are the most sensitive of all since they are of similar make-up to photoresist and, thus, must be protected during striping. It has been found that the organic lo-k materials are chemically altered so that the dielectric constant is higher, and the oxygen plasma may also strip a portion of the lo-k material as well.

For example, when forming a via, a photoresist mask is deposited on the ILD and an opening is formed therein, as by anisotropic etching, to expose an underlying metal feature along with portions of the ILD. The photoresist mask is then stripped, typically employing an oxygen-containing plasma. Upon employing a carbon-containing dielectric material, such as BCB, as the ILD, the exposed portions thereof are subjected to the oxygen-containing plasma causing an increase in the dielectric constant of the carbon-containing dielectric material along with the photoresist mask, thereby adversely impacting capacitance and device reliability.

Recent attempts have also resulted in the use of low-density materials, such as an aerogel, which has a lower dielectric constant than dense silicon oxide. The dielectric constant of a porous silicon dioxide, such as an aerogel, can be as low as 1.2, thereby potentially enabling a reduction in the RC delay time. However, conventional practices for producing an aerogel require a super critical drying step, which increases the cost and degree of complexity for semiconductor manufacturing. Moreover, the use of an aerogel results in a semiconductor device which lacks sufficient structural integrity.

In view of the potential advantages of employing relatively low dielectric constant carbon-containing dielectric materials in high density, multi-level interconnection patterns, there exists a need for methodology enabling the removal of a photoresist mask without increasing the dielectric constant or causing removal, of such carbon-containing dielectric materials.

DISCLOSURE OF THE INVENTION

An advantage of the present invention is a method of manufacturing a semiconductor device exhibiting reduced parasitic RC time delays employing carbon-containing (i.e., organic) dielectric materials having a low dielectric constant.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising depositing a carbon-containing dielectric layer; forming a photoresist mask on the carbon-containing dielectric layer; forming an opening in the carbon-containing layer; and removing the photoresist mask with a plasma containing hydrogen and nitrogen.

Embodiments of the present invention include forming a low dielectric constant carbon-containing layer, e.g., BCB, on an exposed metal feature overlying a semiconductor wafer, forming a photoresist mask on the dielectric layer, forming a damascene opening in the dielectric layer exposing the underlying metal feature and a portion of the carbon-containing dielectric layer and stripping the photoresist mask with a plasma containing about 1 to about 10 vol. % hydrogen and about 90 to about 99 vol. % nitrogen. Embodiments of the present invention also include preheating the wafer to a temperature of about 150° C. to about 275° C., e.g., about 250° C., to improve photoresist stripping efficiency.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
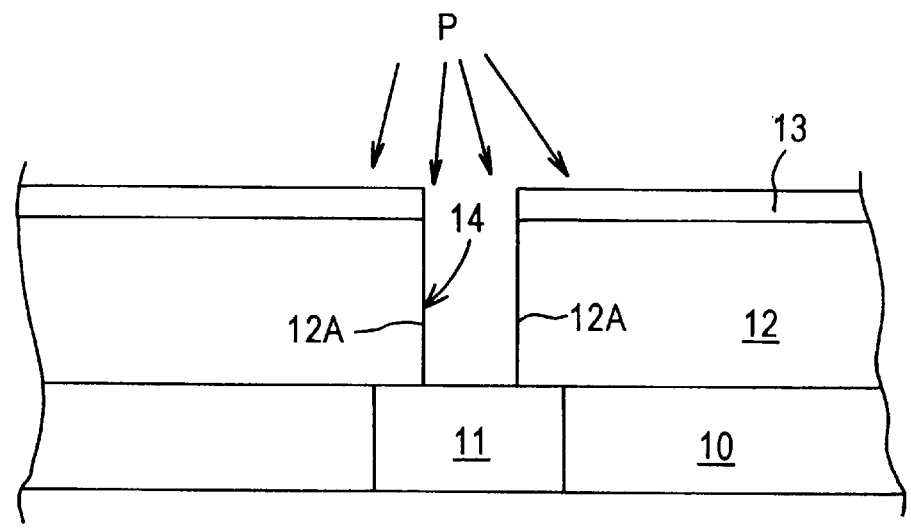
FIG. 1 schematically illustrates a portion of an interconnect to which embodiments of the present invention are applicable.

The present invention addresses and solves problems attendant upon conventional multi-layer interconnection devices, particularly parasitic RC time delays. The capacitance, both layer-to-layer and within -layer, is primarily attributed to the film properties of the ILD. The present invention enables the use of various low dielectric constant carbon-containing dielectric materials for gap filling and ILDs without encountering a degradation in the dielectric properties, i.e., an increase in the dielectric constant. In accordance with the present invention, conventional methodology is modified by removing the photoresist mask employing a plasma containing nitrogen and hydrogen, thereby preventing degradation of exposed portions of the carbon-containing dielectric material and/or removal of the portion of the exposed carbon-containing dielectric material.

Embodiments of the present invention comprise removing the photoresist mask employing a plasma containing about 1 to about 10 vol. % of hydrogen, such as about 2 to about 6 vol. % hydrogen, e.g., about 4 or 5% hydrogen, and about 99 to about 90 vol. % nitrogen, e.g., about 96% nitrogen. Given the present disclosure and objectives, optimum plasma conditions can be readily determined in a particular situation depending upon, e.g., the particular carbon-containing dielectric material and photoresist material employed. Generally, it has been found suitable to strip the conventional photoresist masks employing a plasma containing nitrogen and hydrogen at a suitable temperature, e.g., about 250° C., and a pressure of about 1,000 to about 1,400 mTorr., e.g., about 1,200 mTorr.

Embodiments of the present invention further include preheating the wafer undergoing processing to improve the efficiency of photoresist stripping. For example, a typical wafer is placed on a platen which is heated, as by a direct heating element or microwave energy, to a temperature of about 150° C. to about 275° C., such as about 230° C. to about 270° C., e.g., about 250° C. Embodiments of the present invention further include supplementing such preheating by employing an infrared lamp, as at about 30% to about 70% power, e.g., about 50% power, to rapidly elevate the platen temperature to about 250° C., as in about 5 to about 7 seconds. Such rapid preheating improves the efficiency of photoresist stripping enabling removal rates of about 30,000 Å to about 40,000 Å per minute. Embodiments of the present invention include continuing such preheating throughout photoresist stripping.

The present invention is applicable to a wide variety of low dielectric constant carbon-containing materials which undergo degradation in dielectric properties and/or removal during photoresist stripping. Such carbon-containing materials include various polymers, e.g., polyamides, BCB, MSQ, FLARE®, Silk®, JSR and Black Diamond®. The present invention comprises the use of various carbon-containing dielectric materials as gap filling layers and/or ILDs. The present invention is particularly applicable to the use of carbon-containing materials as ILDs employing damascene processing, including single and dual damascene processing.

An embodiment of the present invention is schematically illustrated in FIG. 1 wherein reference numeral 11 denotes a lower metal feature formed in ILD 10 overlying a substrate or wafer (not shown). A carbon-containing ILD 12, such as BCB or MSQ, is deposited, a photoresist mask 13 formed thereon and an opening 14 etched in ILD 12 exposing an upper surface of underlying metal feature 11. The formation of opening 14 exposes portions 12A of carbon-containing ILD 12. Photoresist mask 13 is then removed employing a plasma P containing hydrogen and nitrogen, e.g., 4 vol. % hydrogen and 96 vol. % nitrogen, without increasing the dielectric constant and/or removing any of exposed portions 12A of carbon-containing ILD 12.

Figure 2:
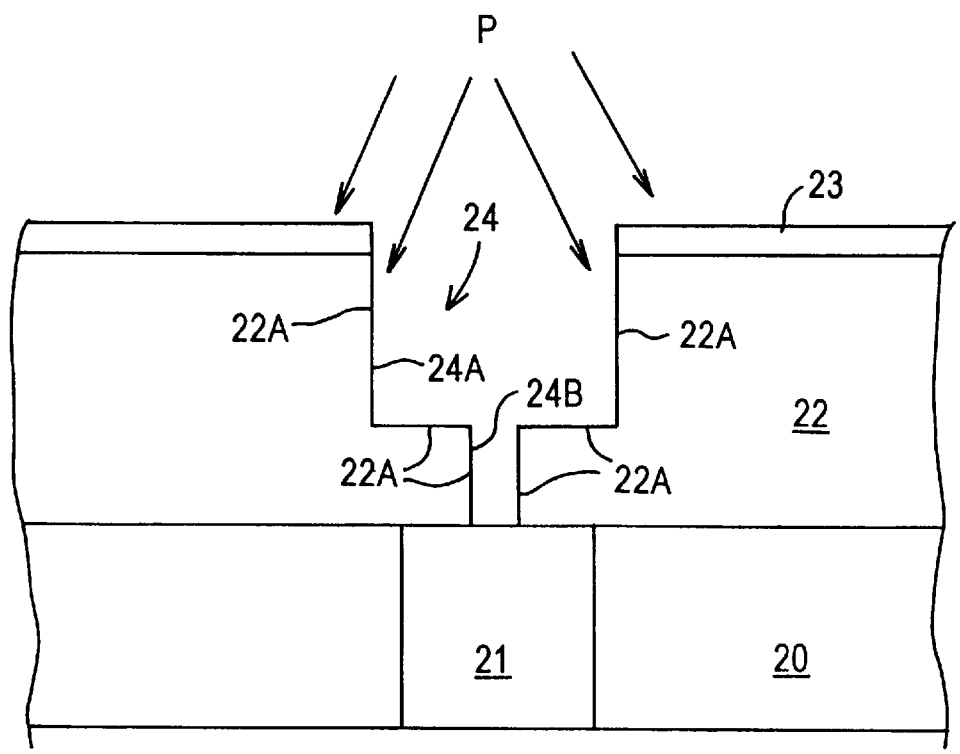
FIG. 2 represents another type of interconnect to which embodiments of the present invention are applicable.

In another embodiment of the present invention involving a dual damascene technique schematically illustrated in FIG. 2, underlying metal feature 21 is formed in ILD 20 overlying a substrate or wafer (not shown). A carbon-containing ILD 22 is formed thereover and dual damascene processing is conducted in a conventional manner to form opening 24 in carbon-containing ILD 22. Dual damascene opening 24 comprises a lower via opening 24B and an upper trench portion 24A communicating with lower via opening 24B. The formation of damascene opening 24 exposes portions 22A of carbon-containing ILD 22, leaving a portion of photoresist 23 overlying carbon-containing ILD 22 as a result of dual damascene processing. In accordance with the present invention, a plasma P containing a nitrogen and hydrogen is employed to remove photoresist 23 from the upper surface of carbon-containing ILD 22 without increasing the dielectric constant and/or removing any of the exposed portions 22A of carbon-containing ILD 22.

The present invention provides methodology enabling a reduction in the RC constant, cross talk voltage and power dissipation between lines employing a low dielectric constant carbon-containing dielectric material, e.g., a carbon-containing dielectric material having a dielectric constant of about 2.0 to about 3.8, by avoiding increasing the dielectric constant and/or undesirable removal thereof. The present invention enjoys industrial applicability in the manufacture of highly integrated semiconductor devices exhibiting increased circuit speed and submicron dimensions, e.g., about 0.18 micron and under. The present invention includes the use of various metals for the interconnection system, such as aluminum, aluminum alloys, copper, copper alloys, as well as tungsten plugs in forming vias. Patterned metal layers can be formed in any conventional manner, as by blanket deposition and etch back techniques or damascene techniques, including single and dual damascene techniques.

Only the preferred embodiment of the present invention and but a few examples of its versatility are shown and described in the present disclosure. It is to be understood that the present invention is capable of using various other combinations and environments and is capable of changes or modifications within the scope of the inventive concept as expressed herein.

What is claimed is:

1. A method of manufacturing a semiconductor device, the method comprising:

depositing a carbon-containing dielectric layer;

forming a photoresist mask on the carbon-containing dielectric layer;

forming an opening in the carbon-containing layer; and removing the photoresist mask with a plasma containing hydrogen and nitrogen, wherein said plasma contains about 1 to about 10 vol % hydrogen and about 90 to about 99 vol % nitrogen.

2. The method according to claim 1, wherein the carbon-containing dielectric layer is an inter-layer dielectric.

3. The method according to claim 1, wherein the carbon-containing dielectric layer has a dielectric constant of about 2.0 to about 3.8.

4. The method according to claim 1, wherein the carbon-containing dielectric layer comprises a polymer having a back bone containing carbon.

5. The method according to claim 4, wherein the carbon-containing dielectric layer comprises benzocyclobutene (BCB) or methyl silsesquioxane (MSQ).

6. The method according to claim 1, wherein the plasma contains about 2 to about 6 vol. % hydrogen.

7. The method according to claim 1, comprising removing the photoresist mask with the plasma at a temperature of about 250° C. at a pressure of about 1,000 to about 1,400 m Torr.

8. The method according to claim 7, comprising:

depositing the carbon-containing dielectric layer overlying a wafer; and preheating the wafer to a temperature of about 150° C. to about 275° C.

9. The method according to claim 8, comprising preheating the wafer to a temperature of about 230° C. to about 270° C.

10. The method according to claim 9, comprising preheating the wafer to about 250° C. in about 5 to about 7 seconds.

11. The method according to claim 8, comprising preheating the wafer by placing the wafer on a platen and heating the platen.

12. The method according to claim 11, further comprising preheating the wafer by heating the platen and by infrared radiation.

13. The method according to claim 12, comprising maintaining heating of the wafer during photoresist removal.

14. The method according to claim 7, comprising removing the photoresist mask at a removal rate of about 3,000 Å to about 4,000 Å per minute.

15. The method according to claim 1, comprising:

forming a patterned metal layer comprising a metal feature;

depositing an inter-layer dielectric comprising the carbon-containing dielectric material on the metal feature; and forming the opening in the inter-layer dielectric exposing the metal feature.

16. The method according to claim 15, wherein the dielectric layer comprises about 0.5 to about 8 mol percent carbon.

17. The method according to claim 15, comprising removing the photoresist mask in the plasma containing nitrogen and hydrogen avoiding an increase in the dielectric constant and/or removing any of the carbon-containing dielectric layer.

18. A method of manufacturing a semiconductor device, the method comprising:
   depositing a carbon-containing dielectric layer;
   forming a photo resist mask on the carbon-containing dielectric layer;
   forming an opening in the carbon-containing layer; and
   removing the photo resist mask with a plasma consisting of hydrogen and nitrogen.

* * * * *